(12) United States Patent
Pyo

(10) Patent No.: US 6,337,276 B1
(45) Date of Patent: Jan. 8, 2002

(54) METHODS OF FORMING A COPPER WIRING IN A SEMICONDUCTOR DEVICE USING CHEMICAL VAPOR DEPOSITION

(75) Inventor: Sung Gyu Pyo, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/721,968

(22) Filed: Nov. 27, 2000

(30) Foreign Application Priority Data

Dec. 22, 1999 (KR) .......................................... 99 60562

(51) Int. Cl.[7] .............................................. H01L 21/44
(52) U.S. Cl. ...................... 438/687; 438/681; 438/680
(58) Field of Search ............................... 438/687, 681, 438/680, 648, 627, 631

(56) References Cited

U.S. PATENT DOCUMENTS

| | | | | |
|---|---|---|---|---|
| 6,015,749 A | * | 1/2000 | Liu et al. ..................... | 438/628 |
| 6,090,963 A | * | 7/2000 | Zhuang et al. ............... | 556/112 |
| 6,165,555 A | * | 12/2000 | Jun et al. ..................... | 427/252 |
| 6,245,655 B1 | * | 6/2001 | Moslehi ....................... | 438/612 |

FOREIGN PATENT DOCUMENTS

WO   WO 00/63461   *  4/1999   ........... C23C/18/38

OTHER PUBLICATIONS

"(hfac)Cu(I)(MP) and (hfac)Cu(I)(DMB) for the chemical vapor deposion of thin film", Kang et al. May 1999, Thin Film Solids 350 (1999) 10–13.*

* cited by examiner

Primary Examiner—Vu A. Le
Assistant Examiner—Bradley K Smith
(74) Attorney, Agent, or Firm—Finnegan, Henderson, Farabow, Garrett & Dunner, L.L.P.

(57) ABSTRACT

There is disclosed a method for forming a copper wiring in a semiconductor device. The method establishes a metal organic chemical vapor deposition process technology in which 1,1,1,5,5,5-hexafluoro-2,4-pentadionato (3,3-dimethyl-1-butene)-copper(I) ((hfac)Cu(DMB)) compound is used as a copper precursor by optimally setting deposition process conditions of a copper deposition equipment having a bubbler, a direct liquid injection (DLI) system, a control evaporation mixer (CEM) and a vaporizer of an orifice type or a spray type. Accordingly it can not only realize reappearance of the copper deposition process but also obtain a copper thin film having a good film quality.

75 Claims, 3 Drawing Sheets

METHODS OF FORMING A COPPER WIRING IN A SEMICONDUCTOR DEVICE USING CHEMICAL VAPOR DEPOSITION

FIELD OF THE INVENTION

The invention relates generally to a method of forming a copper wiring in a semiconductor device, and more particularly to, a method of forming a copper wiring in a semiconductor device capable of not only realizing reappearance (also expressed as reproducibility) of the copper deposition process but also obtaining a copper thin film having a good film quality, by establishing a metal organic chemical vapor deposition (MOCVD) process technology in which 1,1,1,5,5,5-hexafluoro-2,4-pentadionato (3,3-dimethyl-1-butene)-copper(I) (hereinafter called (hfac)Cu(DMB)) compound is used as a copper precursor.

BACKGROUND OF THE INVENTION

As semiconductor industries move into an ultra large scale integration, the geometry of devices reduces to a sub-half-micron region, while the circuit density thereof become increased in view of improved performance and reliability. Due to these reasons, a copper thin film is usually employed as an interconnection material useful in an integration circuit since the melting point of the copper thin film is higher than that of an aluminum thin film in forming a metal wiring in a semiconductor device. Thus interconnections made from copper thin film improves the reliability of a semiconductor device due to its higher resistance against electro-migration (EM) and also increases signal transfer speed due to its low resistivity.

In a method of forming a copper wiring, the copper deposition process is an important process in realizing higher device reliability and higher integrated device signal transfer speed. Thus, the copper deposition process employs various deposition methods such as physical vapor deposition (PVD), electroplating, electroless-plating and metal organic chemical vapor deposition (MOCVD). Because deposition methods, such as the MOCVD method, are significantly affected by a copper precursor, there is a need for a process that can easily deposit a copper precursor. Furthermore, a delivery system by which the copper can be safely moved must also be developed.

The MOCVD method of copper deposition may employ several types of liquid delivery systems (hereinafter called LDS), including: an LDS employing a bubbler method; an LDS such as direct liquid injection (hereinafter called DLI); an LDS such as control evaporation mixing (hereinafter called CEM); and an LDS having a vaporizer of an orifice type or a spray type. A compound comprising a copper metal called a precursor in an LDS is degraded to form a copper deposition.

In the copper precursor used in MOCVD, two compounds were developed. These compounds were copper II valence (Cu) compound such as 1,1,1,5,5,5,5-hexafluoro-2,4-pentadionato-copper(II) and Cu (hfac)$_2$ compound, each having a low vapor pressure. Following the development of these two compounds, another compound, copper I valence (CU$^I$), has been developed. Copper I valence (CU$^I$) has a high deposition speed since it has a higher vapor pressure than the copper II valence compound and allows high quality copper thin film deposition at a low temperature of 150–250° C. The 1,1,1,5,5,5-hexafluoro-2,4-pentadionato (trimethylvinylsilane)-copper(I) (hereinafter called (hfac)Cu (TMVS)) compound of the currently-developed various copper I valence compounds is a representative copper precursor for use in that has been widely used since it remains at a liquid phase at room temperature and allows a high quality copper thin film at a low temperature. Even with these advantages, however, the (hfac)Cu(TMVS) compound has a problem that it is degraded at room temperature. Thus, the (hfac)Cu(TMVS) compound has reappearance problems when applied to the process of manufacturing a semiconductor device. Accordingly, although the (hfac)Cu(TMVS) compound is high in vapor pressure among the developed several precursors, it is low in securing reappearance in the conventional LDS. As such, the (hfac)Cu(TMVS) compound will have great difficulty in securing reappearance unless a new LDS that can be safely carried is developed.

Further, as the range between the vaporization temperature and the condensation temperature in the (hfac)Cu(TMVS) compound is extremely narrow, there is a problem that it has to keep the temperature constant. Also, the (hfac)Cu(TMVS) compound can only be safely used for about one year if used with a stabilizer.

In order to solve the problems with in the (hfac)Cu(TMVS) compound, a (hfac)Cu(DMB) compound has been developed as a precursor. The (hfac)Cu(DMB) compound is a new compound that is developed using 3,3-dimethyl-1-butene (hereinafter called DMB) as Lewis base ligand. DMB used in this compound has a low molecular weight and high vapor pressure. Because the (hfac)CuODMB) compound uses DMB instead of a methyl group of VTMS as a Lewis base ligand, the compound has a higher vapor pressure than the (hfac)Cu(TMVS). Therefore, the (hfac)Cu(DMB) compound is a good precursor since it can significantly improve a poor deposition speed, which is one of the biggest problems in a MOCVD Cu precursor. However, because a MOCVD process technology using the (hfac)Cu(DMB) precursor in a conventional LDS has not been established, the (hfac)Cu(DMB) compound has not been commercialized.

SUMMARY OF THE INVENTION

It is therefore an object of the present invention to provide a method of forming a copper wiring in a semiconductor device capable of not only realizing reappearance of a copper deposition process without developing a new LDS, but also obtaining a copper thin film having a good film quality deposition process. This is performed by optimally setting the conditions of a copper deposition apparatus to establish a MOCVD process technology in which a (hfac)Cu(DMB) compound is used as a precursor.

In order to accomplish the above object, a method of forming a copper wiring in a semiconductor device according to the present invention is characterized in that it comprises the steps of forming an interlayer insulating film on a semiconductor substrate in which various components for forming a semiconductor device are formed; forming a contact hole and a trench on said interlayer insulating film and then forming a diffusion barrier layer on the surface of said interlayer insulating film including said contact hole and said trench; depositing Cu so that said contact hole and said trench can be sufficiently filled; using a (hfac)Cu(DMB) precursor by metal organic chemical vapor deposition (MOCVD) method in a bubbler provided with a reactive chamber, a direct liquid injection system, a control evaporation mixer or a liquid delivery system having a vaporizer of an orifice type or a spray type; and forming a copper wiring by performing a chemical mechanical polishing process.

In the case of using a bubbler provided with a reactive chamber, the temperature of a canister in the bubbler is in the range of 30–70° C. The carrier gas induced into the canister of the bubbler is at least one of helium (He), hydrogen ($H_2$), argon (Ar) and the flow rate thereof is in the range of 10–700 sccm. The temperature of all the gas lines and the source lines from the canister of the bubbler to the reactive chamber are kept the same as that of the canister of the bubbler. The internal temperature of the reactive chamber and the temperature of the showering head in the reactive chamber are kept the same as that of the canister of the bubbler.

In the case of using a direct liquid injection system provided with a reactive chamber, the temperature of the vaporizer in the direct liquid injection is in the range of 40–120° C. The temperature of the carrier gas induced into the vaporizer of the direct liquid injection is controlled to be about 20° C. higher than that of the vaporizer of the direct liquid injection. The carrier gas is at least one of helium (He), hydrogen ($H_2$), argon (Ar) and the flow rate thereof is in the range of 10–700 sccm. The temperature of all the gas lines and the source lines from the vaporizer of the direct liquid injection to the reactive chamber are kept the same as that of the vaporizer. The internal temperature of the reactive chamber and the temperature of the showering head in the reactive chamber are kept the same as that of the vaporizer of the direct liquid injection.

In the case of using a control evaporation mixer provided with a reactive chamber, the temperature of a control valve in the vaporizer of the control evaporation mixer is kept at a room temperature. The temperature of a heat exchanger in the vaporizer is in the range of 40–120° C. The temperature of the carrier gas induced into the control valve in the vaporizer of the control evaporation mixer is controlled to be 20–120° C. lower or higher than that of the heat exchanger of the vaporizer. The carrier gas is at least one of helium (He), hydrogen ($H_2$), argon (Ar) and the flow rate thereof is in the range of 10–700 sccm. The temperature of all the gas lines and the source lines from the vaporizer of the control evaporation mixer to the reactive chamber are kept the same as or 5–20° C. higher than that of the heat exchanger of the vaporizer. The internal temperature of the reactive chamber and the temperature of the showering head are kept the same as that of the heat exchanger in the vaporizer of the control evaporation mixer.

In the case of using a liquid delivery system provided with a reactive chamber and having a vaporizer of an orifice type or a spray type, the temperature of the vaporizer is in the range of 20–120° C. The temperature of the carrier gas induced into the vaporizer is controlled to be 40–140° C. which is 20° C. higher than that of the vaporizer. The carrier gas is at least one of helium (He), hydrogen ($H_2$), argon (Ar) and the flow rate thereof is in the range of 10–700 sccm. The temperature of all the gas lines and the source lines from the vaporizer to the reactive chamber are kept the same as that of the vaporizer. The internal temperature of the reactive chamber and the temperature of the showering head are kept the same as that of the vaporizer.

Meanwhile, the (hfac)Cu(DMB) precursor can be used without any additives. However, when any additive is used in the (hfac)Cu(DMB) precursor, the DMB of 0.1–30% can be added or Hhfac of 0.1–20% can be added or a combination of DMB and Hhfac can be added, as a additive.

BRIEF DESCRIPTION OF THE DRAWINGS

The aforementioned aspects and other features of the present invention will be explained in the following description, taken in conjunction with the accompanying drawings, wherein.

DESCRIPTION OF THE PREFERRED EMBODIMENTS

Figure 1:
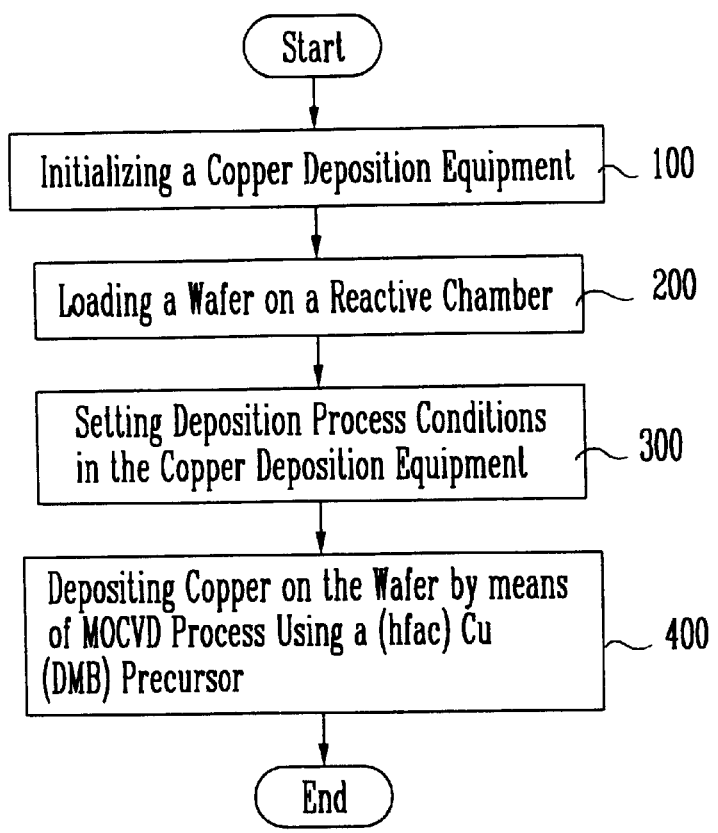
FIG. 1 is a flowchart for explaining a method of forming a copper wiring in a semiconductor device according to the present invention.

The present invention will be described in detail by way of a preferred embodiment with reference to accompanying drawings, in which the reference numerals are used to identify the same or similar parts.

Referring now to FIG. 1, there is shown a flowchart for explaining a method of forming a copper wiring in a semiconductor device according to the present invention.

A copper deposition process according to the present invention begins with the step of initializing a copper deposition (step 100). When the initializing step is complete, a wafer, on which copper will be deposited, is loaded into a reactive chamber (step 200). After the wafer is placed in the chamber, the deposition process conditions are set in the copper deposition equipment (step 300). Finally, when the deposition process conditions are set, copper is deposited on the wafer by means of MOCVD process using a (hfac)Cu (DMB) precursor (step 400).

Among the process steps, the step of setting deposition process conditions in the copper deposition equipment (step 300) is an important step for accomplishing the object of the present invention. In other words, only when the deposition process conditions are optimally set, the MOCVD process technology using the (hfac)Cu(DMEB) compound can be established.

In order to optimally set the deposition process conditions, the characteristics of the (hfac)Cu(DMB) compound as a copper precursor and of the copper deposition equipment must be known.

First, the characteristics of the (hfac)Cu(DMB) compound of a copper precursor are as follows:

When the (hfac)Cu(DMB) precursor is compared with the (hfac)Cu(TMVS) precursor in structure, there is no difference in structure except for the condition that Si is replaced with C in the middle of neutral ligand in the (hfac)Cu(DMB) precursor. Reviewing the results of TGAlDSC on the (hfac) Cu(TMVS) precursor and the (hfac)Cu(DMB) precursor, it has been found that the (hfac)Cu(TMVS) precursor is degraded at the temperature of 63° C. while the (hfac)Cu (DMB) precursor is degraded at the temperature of about 90° C. Thus, it can be seen that the (hfac)Cu(DMB) precursor has good thermal stability. Along with thermal stability, one of the most important factors affecting the characteristics of a precursor is vapor pressure.

After reviewing the results of measuring vapor pressure, it is found that the (hfac)Cu(DMB) precursor has nearly a 1 order higher vapor pressure than the (hfac)Cu(TMVS) precursor. In concrete, it is found that the vapor pressure of the (hfac)Cu(TMVS) precursor is 2.01 at the temperature of 55° C. while the vapor pressure of the (hfac)Cu(DMB) precursor is 2.01 at the temperature of 43.5° C., 3.10 at the temperature of 54° C., 5.26 at the temperature of 66° C., 8.75 at the temperature of 78° C. and 12.93 at the temperature of 88° C. Also, it is reported that the (hfac)Cu(DMB) precursor generates degradation deposits at the temperature of about 96° C. Thus, it can be seen that the degradation temperature of the (hfac)Cu(DMB) precursor is higher than that of the (hfac)Cu(TMVS) precursor. Considering these results, as the degradation temperature of the (hfac)Cu(DMB) precursor is much higher than that of the (hfac)Cu(TMVS) precursor, it has the potential by which much higher vaporization temperature can be available. Also, as the (hfac)Cu(DMB) precursor has a much higher vapor pressure, it can easily obtain the deposition speed of more than 1000 Å/min.

The characteristics of the copper deposition equipment for performing a MOCVD process using the (hfac)Cu(DMB) compound is as follows:

The copper deposition equipment used in the MOCVD process is generally consisted of a LDS and a reactive chamber. A representative LDS currently applied to carry a copper precursor includes a bubbler, DLI, CEM and an LDS having a vaporizer of an orifice type or a spray type.

Figure 2:
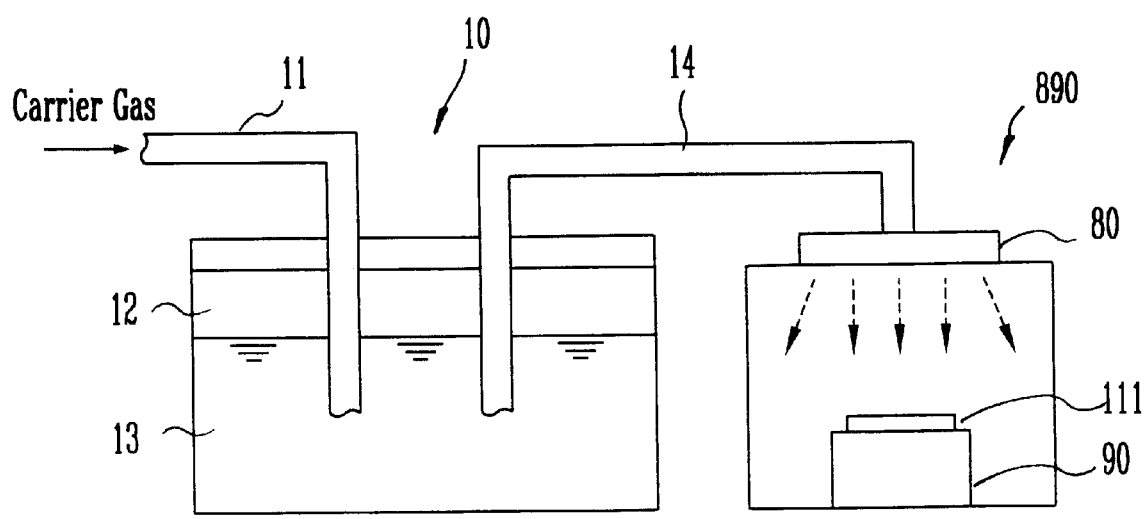
FIG. 2 is a schematic view of a bubbler including a reactive chamber, for explaining a method of forming a copper wiring in a semiconductor device according to the present invention.

FIG. 2 is a schematic view of a bubbler including a reactive chamber, for explaining a method of forming a copper wiring in a semiconductor device according to the present invention.

The bubbler 10 includes a carrier gas inflow line 11, a canister 12, an evaporation gas inflow/outflow line 14. The MOCVD process using the bubbler 10 includes inducing a carrier gas into the canister 12 via the carrier gas inflow line 11, mixing the induced carrier gas with a metal liquid material 13 contained in the canister 12 at a given ratio and then inducing the mixed carrier gas into the reactive chamber 890 via the evaporation gas inflow/outflow line 14.

The reactive chamber 890 consists of a showering head 80 for spraying the vaporized material supplied from the bubbler 10 and a susceptor plate 90 for loading a wafer 111.

In the bubbler 10, the ratio of the carrier gas to the metal liquid material is determined by the flow rate of the carrier gas, the temperature of the bubbler and the internal pressure of the bubbler. This type of the bubbler is not suitable for use in a liquid material having a low vapor pressure such as a copper liquid material. Specifically, because the temperature of the bubbler must be remain constant, the copper liquid material is degraded and particles are thus generated from it. The problem with this degradation is that it adversely affects the semiconductor deposition film, lowers its reappearance and causes a very low deposition speed.

Figure 3:
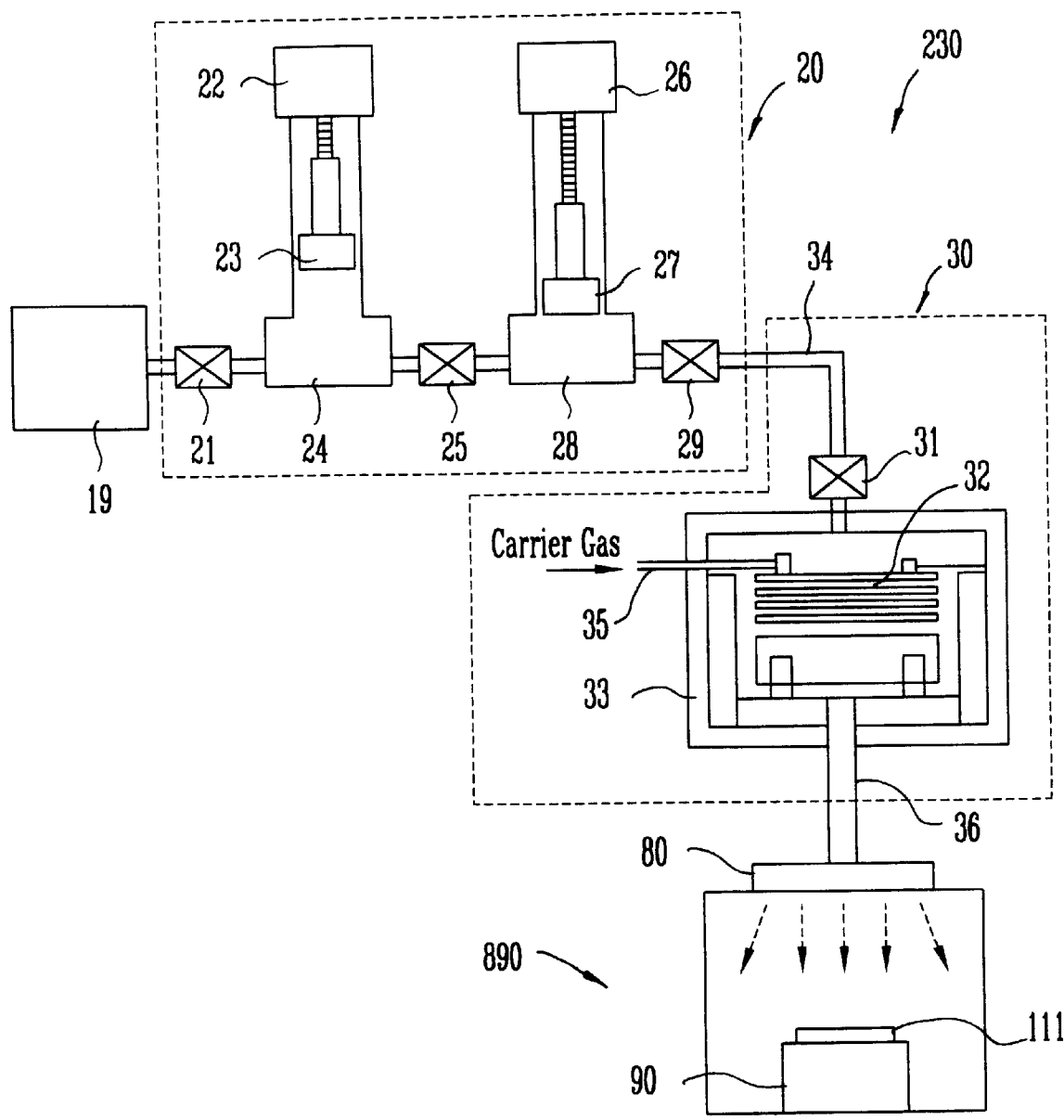
FIG. 3 is a schematic view of a DLI including a reactive chamber, for explaining a method of forming a copper wiring in a semiconductor device according to the present invention.

FIG. 3 is a schematic view of a DLI system including a reactive chamber, for explaining a method of forming a copper wiring in a semiconductor device according to the present invention.

The DLI system 230 consists of a micro-pump 20 and a vaporizer 30 and has a structure in which liquid materials are vaporized from a metal disk 32. The liquid material of an ampule 19 is pressurized at the pressure of about 20 psi and then transferred to the micro-pump 20 via a first valve 21. At this time, while a first stepping motor 22 raises a first piston 23, the liquid material fills in the first cylinder 24. Then, while the first valve 21 is closed, a second valve 25 is opened, the first piston 23 is lowered and the second stepping motor 26 simultaneously raises the second piston 27. This enables the liquid material filled in the first cylinder 24 to fill the second cylinder: 28 via the second valve 25.

Thereafter, as the second valve 25 is closed, the third valve 29 is opened and the second piston 27 is lowered, the liquid material is transferred to the vaporizer 30 via the third valve 29. At this time, as the first valve 21 is opened arid the first piston is raised, the liquid material fills in the first cylinder 24 again. With these repeating operations, the liquid material is supplied into the vaporizer 30 via the micro-pump 20. The flow control is determined by the number of cycles of the first and second stepping motors 22 and 26. The liquid material thus supplied from the micro-pump 20 is induced into the 99-stacked metal disks 32 via the delivery valve 31 provided on the liquid inflow line 34, and then vaporized by a heating zone 33. The vaporized gas is induced into the reactive chamber 890 via the evaporation gas inflow/outflow line 36 along with a carrier gas induced via the carrier gas inflow line 35.

The reactive chamber 890 consists of a showering head 80 for spraying the vaporized material supplied from the DLI system 230 and a susceptor plate 90 for loading the wafer 111.

The DLI system 230 is constructed in which the liquid material therein is induced between the 99-stacked metal disks 32 and then vaporized at the vaporizer 30. Thus, DLI system 230 has good thermal exchange efficiency since it has a very wide thermal exchange and can transfer the induced liquid material in a wide range of pressures, including several tens through several hundreds psi. However, because the internal pressure of the vaporizer 30 is maintained at a very low pressure of about a several Torr, the DLI system 230 can give a volume expanding effect depending on the difference of the pressure. Thus, the DLI system 230 can maximize the vaporization efficiency. However, the DLI system has the disadvantage that it is difficult to maintain the pressure of the liquid material constant and it takes a very long time to get the pressure of the liquid material at a state of equilibrium. Reaching equilibrium takes a long time because the DLI system relies on the induced liquid material to drive the metal disks 32 and it is constructed so that the micro-pump 20 can form the pressure. Further, when the liquid material is suctioned at an initial state, there is a problem that the vaporizer 30 is clogged since a large amount of liquid material induced into the metal disks 32 remained un-vaporized.

Figure 4:
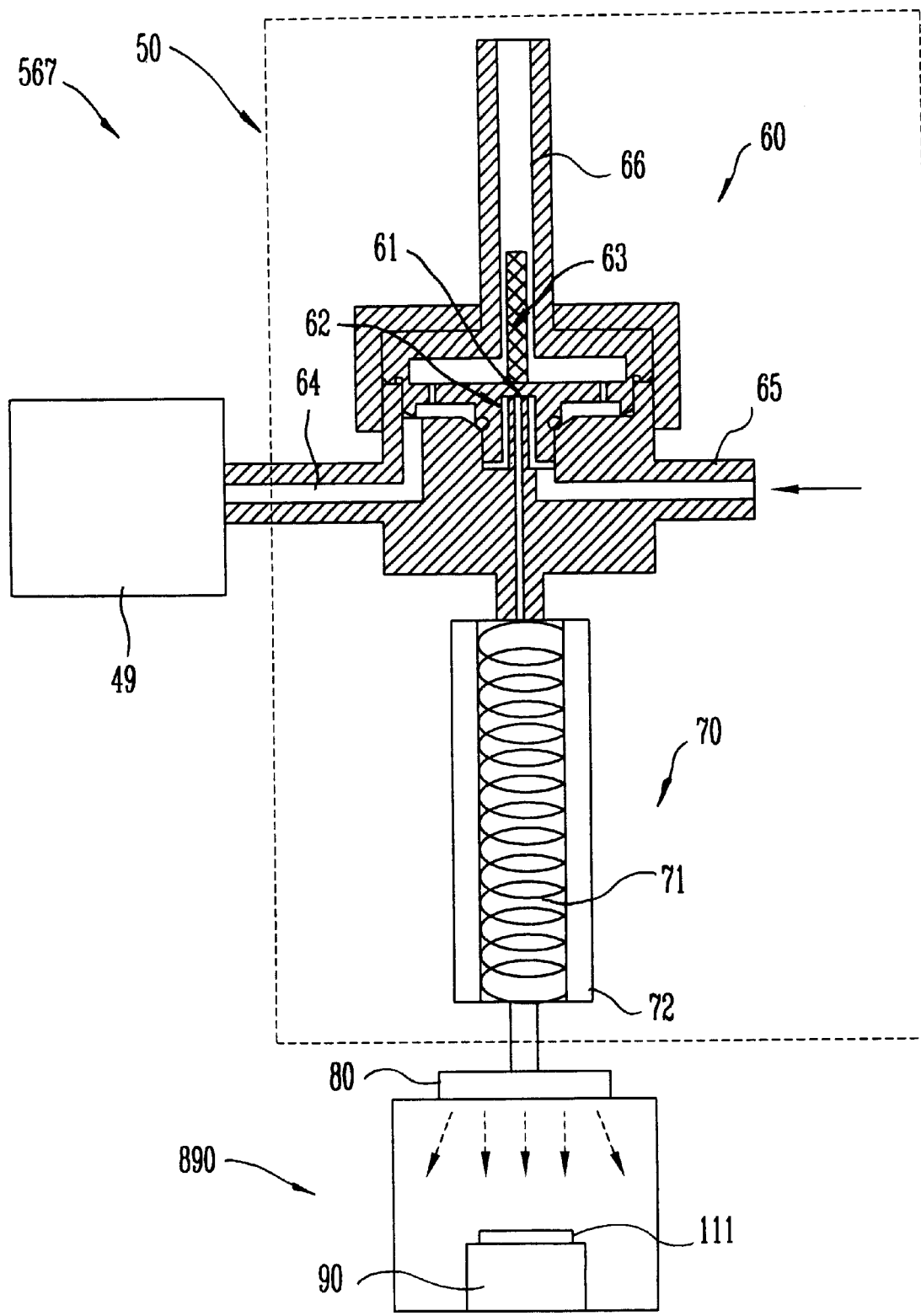
FIG. 4 is a schematic view of a CEM including a reactive chamber, for explaining a method of forming a copper wiring in a semiconductor device according to the present invention.

FIG. 4 is a schematic view of a CEM including a reactive chamber, for explaining a method of forming a copper wiring in a semiconductor device according to the present invention.

The CEM 567 consists of a liquid mass flow controller 49 (hereinafter called LMFC) and a vaporizer 50, wherein a liquid material is vaporized at a heat exchanger 70. The vaporizer 50 is consists of a control valve 60 and a heat exchanger 70. The control valve 60 consists of an orifice 61, a mixer 62 and actuator 63, a liquid inflow line 64 for supplying a liquid material, a carrier gas inflow line 65 for supplying a carrier gas and a liquid vent line 66. The heat exchanger 70 is provided with a spiral tube 71. When the carrier gas passes through the mixer 62, a severe spiral flow is formed, so that the liquid material passed through the orifice 61 is transferred to the heat exchanger 70 at the form of a mist. The liquid material mixed with the carrier gas at the mixer 62 is vaporized while passing through the spiral tube 71. Then, the vaporized gas is induced into the reactive chamber 890 via the vaporized gas inflow/outflow line 72.

The reactive chamber 890 consists of a showering head 80 for spraying the vaporized material supplied from the CEM 567 and a susceptor plate 90 for loading the wafer 111.

In the vaporizer 50 of the CEM 567, the orifice 61 will be rarely clogged since it is not directly heated. However, because the orifice has a very low conductance and vaporization is generated at the long spiral tube 71, there is the problem that particles are likely to form due to condensation and degradation of the liquid material.

In the case of depositing copper by a MOCVD method using a (hfac)Cu(DMB) compound as a copper precursor and the bubbler 10 provided with the reactive chamber shown in FIG. 2, the copper deposition process conditions for realizing reappearance of a copper deposition process are as follows:

In order to vaporize the (hfac)Cu(DMB) compound being a copper precursor, the temperature of the canister 12 is kept in the range of 30–70° C. The carrier gases induced into the canister 12 via the carrier gas inflow line 11 may include helium (He), hydrogen ($H_2$), argon (Ar) and the flow rate thereof is in the range of 10–700 sccm. In order to improve the conductance of the (hfac)Cu(DMB) compound while preventing the degradation and condensation thereof that is vaporized at the canister 12, the temperature of all the gas lines and the source lines from the canister 12 to the reactive chamber 890 are kept the same as that of the canister 12. In order to completely evacuate impurities while the vaporized (hfac)Cu(DMB) compound induced into the reactive chamber 890 is degraded and then pure copper components can be deposited on the wafer 111, the internal temperature of the reactive chamber 890 and the temperature of the showering head 80 are kept the same as that of the canister 12. At this time, the temperature of the susceptor plate 90 into which the wafer 111 is loaded is kept in the range of 120–280° C. Also, the internal pressure of the reactive chamber 890 is kept in the range of 0.1–5 torr. The distance between the showering head 80 and the susceptor plate 90 is 1–50 mm. The (hfac)Cu(DMB) compound used as a copper precursor can be used without any additives. However, when any additive is used in the (hfac)Cu(DMB) compound, the DMB of 0.1–30% can be added or Hhfac of 0.1–20% can be added or a combination of DMB and Hhfac can be added, as a additive.

In the case of depositing copper by MOCVD method using a (hfac)Cu(DMB) compound as a copper precursor and the DLI system 230 provided with the reactive chamber 890 shown in FIG. 3, the copper deposition process conditions for realizing reappearance a of copper deposition process are as follows:

In order to vaporize the (hfac)Cu(DMB) compound being a copper precursor, the temperature of the vaporizer 30 is kept in the range of 40–120° C. The temperature of the carrier gas induced into the vaporizer 30 is controlled to be in the range of 60–140° C. which is 20° C. higher than that of the vaporizer 30, so that the compound can be completely evacuated. Available carrier gases may include helium (He), hydrogen ($H_2$), argon (Ar) and the flow rate thereof is in the range of 10–700 sccm. In order to improve the conductance of the (hfac)Cu(DMB) compound while preventing the degradation and condensation thereof that is vaporized at the vaporizer 30, the temperature of all the gas lines and the source lines from the vaporizer 30 to the reactive chamber 890 are kept the same as that of the vaporizer 30. In order to completely evacuate impurities while the vaporized (hfac)Cu(DMB) compound induced into the reactive chamber 890 is degraded and then pure copper components can be deposited on the wafer 111, the internal temperature of the reactive chamber 890 and the temperature of the showering head 80 are kept the same as that of the vaporizer 30. At this time, the temperature of the susceptor plate 90 into which the wafer 111 is loaded is kept in the range of 150–280° C. Also, the internal pressure of the reactive chamber 890 is kept in the range of 0.1–5 torr. The distance between the showering head 80 and the susceptor plate 90 is 1–50 mm. The flow rate of the (hfac)Cu(DMB) compound is in the range of 0.1–1.0 sccm. In the above process, the (hfac)Cu(DMB) compound being a copper precursor can be used without any additives. However, when any additive is used in the (hfac)Cu(DMB) compound, the DMB of 0.1–30% can be added or Hhfac of 0.1–20% can be added or a combination of DMB and Hhfac can be added, as a additive.

In the case of depositing copper by a MOCVD method using a (hfac)Cu(DMB) compound as a copper precursor and the CEM 567 provided with the reactive chamber 890 shown in FIG. 4, the copper deposition process conditions for realizing reappearance a of copper deposition process are as follows:

When the carrier gas passes through the mixer 62 in the vaporizer 50 for vaporizing the (hfac)Cu(DMB) compound, a severe spiral flow is formed, so that the (hfac)Cu(DMB) compound passed through the orifice 61 is transferred to the heat exchanger 70 at the form of mist. Thus, the temperature of the heat exchanger 70 is kept in the range of 40–120° C. while the temperature of the control valve 60 is kept at room temperature. The temperature of the carrier gas induced into the control valve 60 of the vaporizer 50 may be controlled to be higher or lower than that of the heat exchanger 70 of the vaporizer 50, such as in the range of 40–120° C. Available carrier gases may include helium (He), hydrogen ($H_2$), argon (Ar) and the flow rate thereof is in the range of 10–700 sccm. In order to improve the conductance of the (hfac)Cu(DMB) compound while preventing the degradation and condensation thereof that is vaporized at the heat exchanger 70 of the vaporizer 50, the temperature of all the gas lines and the source lines from the vaporizer 50 to the reactive chamber 890 are kept the same as that of the heat exchanger 70 of the vaporizer 50 or in the range of 5–20° C. In order to completely evacuate impurities while the vaporized (hfac)Cu(DMB) compound induced into the reactive chamber 890 is degraded and then pure copper components can be deposited on the wafer 111, the internal temperature of the reactive chamber 890 and the temperature of the showering head 80 are kept the same as that of the heat exchanger 70 of the vaporizer 50. The temperature of the susceptor plate 90 into which the wafer 111 is loaded is kept in the range of 120–280° C. Also, the internal pressure of the reactive chamber 890 is kept in the range of 0.1–5 torr. The distance between the showering head 80 and the susceptor plate 90 is 1–50 mm. The flow rate of the (hfac)Cu(DMB) compound being a copper precursor is in the range of 0.1–1.0 sccm. In the above process, the (hfac)Cu(DMB) compound being a copper precursor can be used without any additives. However, when any additive is used in the (hfac)Cu(DMB) compound, the DMB of 0.1–30% can be added or Hhfac of 0.1–20% can be added or a combination of DMB and Hhfac can be added, as a additive.

In the case of depositing copper by MOCVD method using a (hfac)Cu(DMB) compound as a copper precursor and a liquid delivery system having a vaporizer of an orifice type or a spray type, with which a reactive chamber (not shown) is provided, the copper deposition process conditions for realizing reappearance of a copper deposition process are as follows:

The temperature of the vaporizer for vaporizing the (hfac)Cu(DMB) compound being a copper precursor is kept in the range of 20–120° C. The temperature of the carrier gas induced into the vaporizer is controlled to be in the range of 40–140° C. which is 20° C. higher than that of the vaporizer, so that the compound can be completely evacuated. Available carrier gases may include helium (He), hydrogen ($H_2$), argon (Ar) and the flow rate thereof is in the range of 10–700 sccm. In order to improve the conductance of the (hfac)Cu(DMB) compound while preventing the degradation and condensation thereof that is vaporized at the vaporizer, the temperature of all the gas lines and the source lines from the vaporizer to the reactive chamber are kept the same as that of the vaporizer. In order to completely evacuate impurities while the vaporized (hfac)Cu(DMB) compound induced into the reactive chamber is degraded and then pure copper components can be deposited on the wafer, the internal temperature of the reactive changer and the temperature of the showering head are kept same to that of the vaporizer. The temperature of the susceptor plate into which the wafer is loaded is kept in the range o 120–280° C. Also, the internal pressure of the reactive chamber is kept in the range of 0.1–5 torr. The distance between the showering head and the susceptor plate is 1–50 mm. The flow rate of the (hfac)Cu(DMB) compound is in the range of 0.1–1.0 sccm. In the above process, the (hfac)Cu(DMB) compound being a copper precursor can be used without any additives. However, when any additive is used in the (hfac)Cu(DMB) compound, the DMB of 0.1–30% can be added or Hhfac of 0.1–20% can be added or a combination of DMB and Hhfac can be added, as a additive.

Based on the above copper deposition conditions, a method of forming a copper wiring in a semiconductor device will be now explained in a way by which a bubbler, DLI, CEM or a liquid delivery system having a vaporizer of an orifice type or a spray type is applied.

In the case of depositing copper for a copper thin film by use of the (hfac)Cu(DMB) precursor by a MOCVD method using a bubbler provided with the reactive chamber, as shown in FIG. 2, a method of forming a copper wiring in a semiconductor device according to the present invention is as follows:

An interlayer insulating film is formed on a semiconductor substrate in which various components for forming a semiconductor device are formed. Then, a contact hole and a trench are formed on the interlayer insulating film using a mask and are then experienced by cleaning process. Next, a diffusion barrier layer is formed on the surface of the interlayer insulating film including the contact hole and the trench. In the bubbler provided with the reactive chamber, Cu is plated enough to fill the contact hole and the trench using the (hfac)Cu(DMB) precursor by MOCVD method. When the Cu plating is finished, the Cu plated surface is experienced by hydrogen reduction thermal process and then is experienced by a chemical mechanical polishing (hereinafter called CMP) process, thus forming a copper wiring.

In the above process, the interlayer insulating film is formed of an insulating film having a low dielectric constant below 2.7. The contact hole and the trench are formed in a dual damascene method. The cleaning process may use a RF plasma in case that a bottom layer is made of metals such as tungsten (W) or aluminum (Al), and may use a reactive cleaning method in case that the bottom layer is made of copper (Cu). The diffusion barrier layer may be formed of at least one of ionized PVD TiN, CVD TiN, MOCVD TiN, ionized PVD Ta, ionized PVD TaN, CVD Ta, CVD TaN, CVD WN.

The copper deposition process includes maintaining the temperature of the canister 12 of the bubbler 10 in the range of 30–70° C. in order to vaporize the (hfac)Cu(DMB) compound being a copper precursor. Carrier gases induced into the canister 12 via the carrier gas inflow line 11 may include helium (He), hydrogen ($H_2$), argon (Ar) and the flow rate thereof is in the range of 10–700 sccm. In order to improve the conductance of the (hfac)Cu(DMB) compound while preventing the degradation and condensation thereof that is vaporized at the canister 12, the temperature of all the gas lines and the source lines from the canister 12 to the reactive chamber 890 are kept the same as that of the canister 12. In order to completely evacuate impurities while the vaporized (hfac)Cu(DMB) compound induced into the reactive chamber 890 is degraded and then pure copper components can be deposited on the wafer 111, the internal temperature of the reactive chamber 890 and the temperature of the showering head 80 are kept the same as that of the canister 12. The temperature of the susceptor plate 90 into which the wafer 111 is loaded is kept in the range of 120–280° C. Also, the internal pressure of the reactive chamber 890 is kept in the range of 0.1–5 torr. The distance between the showering head 80 and the susceptor plate 90 is 1–50 mm. The (hfac)Cu(DMB) compound used as a copper precursor can be used without any additives. However, when any additive is used in the (hfac)Cu(DMB) compound, the DMB of 0.1–30% can be added or Hhfac of 0.1–20% can be added or a combination of DMB and Hhfac can be added, as a additive. The hydrogen reduction thermal process includes performing a thermal process in a temperature range of room temperature –350° C. for 30 minutes –3 hours, under a hydrogen reduction atmosphere. This allows the (hfac)Cu(DMB) compound to change into a grain morphology. The hydrogen reduction atmosphere may use hydrogen ($H_2$) only or a hydrogen mixed gas such as $H_2$ +Ar(1–95%), $H_2$+$N_2$ (1–95%). After CMP process, a post-cleaning process may be performed. The cleaning process and the diffusion barrier forming process are performing in-situ with no time delay. Also, the Cu plating process and the hydrogen reduction thermal process may be performed in-situ with no time delay.

In the case of depositing copper for a copper thin film by use of the (hfac)Cu(DMB) precursor by a MOCVD method using a DLI system provided with the reactive chamber shown in FIG. 3, a method of forming a copper wiring in a semiconductor device according to the present invention is as follows:

An interlayer insulating film is formed on a semiconductor substrate in which various components for forming a semiconductor device are formed. Then, a contact hole and a trench are formed on the interlayer insulating film using a mask and are then experienced by cleaning process. Next, a diffusion barrier layer is formed on the surface of the interlayer insulating film including the contact hole and the trench. In the DLI provided with the reactive chamber, Cu is plated enough to fill the contact hole and the trench using the (hfac)Cu(DMB) precursor by MOCVD method. When the Cu plating is finished, the Cu plated surface is experienced by hydrogen reduction thermal process and then is experienced by a chemical mechanical polishing (hereinafter called CMP) process, thus forming a copper wiring.

In the above process, the interlayer insulating film is formed of an insulating film having a low dielectric constant. The contact hole and the trench are formed in a dual damascene method. The cleaning process may use a RF plasma in case that a bottom layer is made of metals such as tungsten (W) or aluminum (Al), and may use a reactive cleaning method in case that the bottom layer is made of copper (Cu). The diffusion barrier layer may be formed of at least one ionized PVD TiN, CVD TiN, MOCVD TiN, ionized PVD Ta, ionized PVD TaN, CVD Ta, CVD TaN, CVD WN. The copper deposition process ensures that the temperature of the vaporizer 30 in the DLI 230 is kept in the range of 40–120° C., and that the temperature of the carrier gas induced into the vaporizer 30 is controlled to be in the range of 60–140° C. which is about 20° C. higher than that of the vaporizer 30. Available carrier gases may include helium (He), hydrogen ($H_2$), argon (Ar) and the flow rate thereof is in the range of 10–700 sccm. In order to improve the conductance of the (hfac)Cu(DMB) precursor while preventing the degradation and condensation thereof that is vaporized at the vaporizer 30, the temperature of all the gas lines and the source lines from the vaporizer 30 to the reactive chamber 890 are kept the same as that of the vaporizer 30. At this time, the temperature of the susceptor plate 90 into which the wafer 10 is loaded is kept in the range of 150–280° C. Also, the internal pressure of the reactive chamber 890 is kept in the range of 0.1–5 torr. The distance between the showering head 80 and the susceptor plate 90 is 1–50 mm. The flow rate of the (hfac)Cu(DMB) precursor is in the range of 0.1–1.0 sccm. The (hfac)Cu(DMB) compound of a copper precursor used in the copper deposition process can be used without any additives. However, when any additive is used in the (hfac)Cu(DMB) compound, the DMB of 0.1–30% can be added or Hhfac of 0.1–20% can be added or a combination of DMB and Hhfac can be added, as a additive. The hydrogen reduction thermal process includes performing a thermal process in a temperature range of room temperature –305° C. for 30 minutes –3 hours, under hydrogen reduction atmosphere in order to change the (hfac)Cu(DMB) compound into a grain morphology. The hydrogen reduction atmosphere may use hydrogen ($H_2$) only or a hydrogen mixed gas such as $H_2+Ar(1-95\%)$, $H_2+N_2$ (1–95%). After the CMP process, a post-cleaning process may be performed. The cleaning process and the diffusion barrier forming process are performing in-situ with no time delay. Also, the Cu plating process and the hydrogen reduction thermal process may be performed in-situ with no time delay.

In the case of depositing copper for a copper thin film by use of the (hfac)Cu(DMB) precursor by MOCVD method using CEM provided with the reactive chamber shown in FIG. 4, a method of forming a copper wiring in a semiconductor device according to the present invention is as follows:

An interlayer insulating film is formed on a semiconductor substrate in which various components for forming a semiconductor device are formed. Then, a contact hole and a trench are formed on the interlayer insulating film using a mask and are then experienced by cleaning process. Next, a diffusion barrier layer is formed on the surface of the interlayer insulating film including the contact hole and the trench. In the CEM provided with the reactive chamber, a copper layer is formed enough to fill the contact hole and the trench on which the diffusion barrier layer is formed, using the (hfac)Cu(DMB) precursor by MOCVD method. When formation of the copper layer is finished, the copper layer is experienced by hydrogen reduction thermal process and then is experienced by CMP process, thus forming a copper wiring in the contact and the trench.

In the above process, the interlayer insulating film is formed of an insulating film having a low dielectric constant. The contact hole and the trench are formed in a dual damascene method. The cleaning process may use a RF plasma in case that a bottom layer is made of metals such as tungsten (W) or aluminum (Al), and may use a reactive cleaning method in case that the bottom layer is made of copper (Cu).

The diffusion barrier layer may be formed of at least one of ionized PVD TiN, CVD TiN, MOCVD TiN, ionized PVD Ta, ionized PVD TaN, CVD TaN, CVD WN. Upon a copper deposition process, the conditions of the CEM provided with the reactive chamber are same to the above mentioned.

The hydrogen reduction thermal process includes performing a thermal process in a temperature range of room temperature –350° C. for 30 minutes –3 hours, under a hydrogen reduction atmosphere. This ensures that the (hfac) Cu(DMB) compound is changed into a grain morphology. Hydrogen reduction atmosphere may use hydrogen ($H_2$) only or a hydrogen mixed gas such as $H_2+Ar(1-95\%)$, $H_2+N_2$ (1–95%). After CMP process, a post-cleaning process may be performed. The cleaning process and the diffusion barrier forming process are performed in-situ with no time delay. Also, the Cu plating process and the hydrogen reduction thermal process may be performed insitu with no time delay.

In the case of depositing copper for a copper thin film by use of the (hfac)Cu(DMB) precursor by MOCVD method using all of the LDSs provided with a reactive chamber and having a vaporizer of an orifice type or a spray type, a method of forming a copper wiring in a semiconductor device according to the present invention is as follows:

An interlayer insulating film is formed on a semiconductor substrate in which various components for forming a semiconductor device are formed. Then, a contact hole and a trench are formed on the interlayer insulating film using a mask and are then experienced by cleaning process. Next, a diffusion barrier layer is formed on the surface of the interlayer insulating film including the contact hole and the trench. In a LDS provided with the reactive chamber and having a vaporizer of an orifice type or a spray type, a copper layer is formed enough to fill the contact hole and the trench on which the diffusion barrier layer is formed, using the (hfac)Cu(DMB) precursor by MOCVD method. When formation of the copper layer is finished, the copper layer is experienced by hydrogen reduction thermal process and then is experienced by CMP process, thus forming a copper wiring in the contact and the trench.

In the above process the interlayer insulating film is formed of an insulating film having a low dielectric constant below 2.7. The contact hole and the trench are formed in a dual damascene method. The cleaning process may use a RF plasma in case that a bottom layer is made of metals such as tungsten (W) or aluminum (Al), and may use a reactive cleaning method in case that the bottom layer is made of copper (Cu). The diffusion barrier layer may be formed of at least one of ionized PVD TiN, CVD TiN, MOCVD TiN, ionized PVD Ta, ionized PVD TaN, CVD Ta, CVD TaN, CVD WN. Upon a copper deposition process, the conditions of the CEM provided with the reactive chamber and having a vaporizer of an orifice type or a spray type are same to the above mentioned. The hydrogen reduction thermal process includes performing a thermal process in a temperature range of room temperature –350° C. for 30 minutes –3 hours, under a hydrogen reduction atmosphere in order to change the (hfac)Cu(DMB) compound into a grain morphology. The hydrogen reduction atmosphere may use hydrogen ($H_2$) only or a hydrogen mixed gas such as $H_2+Ar(1-95\%)$, $H_2+N_2$ (1–95%). After the CMP process, a post-cleaning process may be performed. The cleaning process and the diffusion barrier forming process are performed in-situ with no time delay. Also, the Cu plating process and the hydrogen reduction thermal process may be performed in-situ with no time delay.

As can be understood from the above description, the present invention can not only realize reappearance of the copper deposition process but also obtain a copper thin film having a good film quality, by optimally setting the deposition process conditions of the copper deposition equipment to thus establish a MOCVD process technology in which a (hfac)Cu(DMB) compound is used as a precursor.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a copper wiring in a semiconductor device, comprising the steps of:
    forming an interlayer insulating film on a semiconductor substrate in which various components for forming a semiconductor device are formed;
    forming a contact hole and a trench on said interlayer insulating film;
    forming a diffusion barrier layer on the surface of said interlayer insulating film including said contact hole and said trench;
    depositing Cu so that said contact hole and said trench are filled, using a (hfac)Cu(DMB) precursor by metal organic chemical vapor deposition (MOCVD) method in a bubbler provided with a reactive chamber; and
    forming a copper wiring by performing a chemical mechanical polishing process.

2. The method of forming a copper wiring in a semiconductor device according to claim 1, wherein said contact hole and said trench are formed in a dual damascene method.

3. The method of forming a copper wiring in a semiconductor device according to claim 1, wherein said diffusion barrier layer is formed of at least one of ionized PVD TiN, CVD TiN, MOCVD TiN, ionized PVD Ta, ionized PVD TaN, CVD Ta, CVD TaN and CVD WN.

4. The method of forming a copper wiring in a semiconductor device according to claim 1, wherein the temperature of a canister in said bubbler is in the range of 30–70° C.

5. The method of forming a copper wiring in a semiconductor device according to claim 1, wherein carrier gases induced into said canister of said bubbler uses at least one of helium (He), hydrogen ($H_2$), argon (Ar) gas and the flow rate thereof is in the range of 10–700 sccm.

6. The method of forming a copper wiring in a semiconductor device according to claim 1, wherein the temperature of gas lines and source lines extending from said canister of said bubbler to said reactive chamber are kept the same as that of said canister of said bubbler.

7. The method of forming a copper wiring in a semiconductor device according to claim 1, wherein the internal temperature of said reactive chamber and the of temperature of a showering head in said reactive chamber are kept the same as that of a canister in said bubbler.

8. The method of forming a copper wiring in a semiconductor device according to claim 1, wherein the temperature of a susceptor plate in said reactive chamber is in the range of 120–280° C.

9. The method of forming a copper wiring in a semiconductor device according to claim 1, wherein the internal pressure of said reactive chamber is kept in the range of 0.1–5 torr.

10. The method of forming a copper wiring in a semiconductor device according to claim 1, wherein the distance between a showering head and a susceptor plate in said reactive chamber is in the range of 1–50 mm.

11. A method of forming a copper wiring in a semiconductor device, comprising the steps of:
    forming an interlayer insulating film on a semiconductor substrate in which various components for forming a semiconductor device are formed;
    forming a contact hole and a trench on said interlayer insulating film;
    forming a diffusion barrier layer on the surface of said interlayer insulating film including said contact hole and said trench;
    depositing Cu so that said contact hole and said trench are filled, using a (hfac)Cu(DMB) precursor by metal organic chemical vapor deposition (MOCVD) method in a bubbler provided with a reactive chamber; and
    forming a copper wiring by performing a chemical mechanical polishing process, wherein DMB of 0.1–30% is added or Hhfac of 0.1–20% is added or a combination of DMB and Hhfac is added to the (hfac)Cu(DMB) precursor, as an additive.

12. A method of forming a copper wiring in a semiconductor device, comprising the steps of:
    forming an interlayer insulating film on a semiconductor substrate in which various components for forming a semiconductor device are formed;
    forming a contact hole and a trench on said interlayer insulating film;
    forming a diffusion barrier layer on the surface of said interlayer insulating film including said contact hole and said trench;
    depositing Cu so that said contact hole and said trench are filled, using a (hfac)Cu(DMB) precursor by metal organic chemical vapor deposition (MOCVD) method in a bubbler provided with a reactive chamber; and
    forming a copper wiring by performing a chemical mechanical polishing process, wherein after said Cu deposition step, a hydrogen reduction thermal process is performed in situ with no time delay, wherein the hydrogen reduction thermal process is performed in a temperature range of room temperature −350° C., for a time frame of 30 minutes −3 hours, under a hydrogen reduction atmosphere.

13. The method of forming a copper wiring in a semiconductor device according to claim 12, wherein said hydrogen reduction atmosphere uses any one of $H_2$, $H_2+Ar$ (1–95%) and $H_2+N_2$ (1–95%).

14. A method of forming a copper wiring in a semiconductor device, comprising the steps of:
    forming an interlayer insulating film on a semiconductor substrate in which various components for forming a semiconductor device are formed;
    forming a contact hole and a trench on said interlayer insulating film;
    forming a diffusion barrier layer on the surface of said interlayer insulating film including said contact hole and said trench;
    depositing Cu so that said contact hole and said trench are filled, using a (hfac)Cu(DMB) precursor by metal organic chemical vapor deposition (MOCVD) method in a bubbler provided with a reactive chamber; and
    forming a copper wiring by performing a chemical mechanical polishing process, wherein after the process of forming said diffusion barrier, a cleaning process is performed, and wherein said cleaning process and said diffusion barrier forming process are performed in-situ with no time delay.

15. A method of forming a copper wiring in a semiconductor device, comprising the steps of:

forming an interlayer insulating film on a semiconductor substrate in which various components for forming a semiconductor device are formed;

forming a contact hole and a trench on said interlayer insulating film;

forming a diffusion barrier layer on the surface of said interlayer insulating film including said contact hole and said trench;

depositing Cu so that said contact hole and said trench are filled, using a (hfac)Cu(DMB) precursor by metal organic chemical vapor deposition (MOCVD) method in a direct liquid injection system provided with a reactive chamber; and forming a copper wiring by performing a chemical mechanical polishing process.

16. The method of forming a copper wiring in a semiconductor device according to claim 15, wherein said contact hole and said trench are formed in a dual damascene method.

17. The method of forming a copper wiring in a semiconductor device according to claim 15, wherein said diffusion barrier layer is formed of at least one of ionized PVD TiN, CVD TiN, MOCVD TiN, ionized PVD Ta, ionized PVD TaN, CVD Ta, CVD TaN and CVD WN.

18. The method of forming a copper wiring in a semiconductor device according to claim 15, wherein the temperature of a vaporizer in said direct liquid injection system is in the range of 40–120° C.

19. The method of forming a copper wiring in a semiconductor device according to claim 15, wherein the temperature of a carrier gas induced into a vaporizer in said direct liquid injection system is controlled to be about 20° C. higher than that of the temperature of the vaporizer in said direct liquid injection system.

20. The method of forming a copper wiring in a semiconductor device according to claim 19, wherein said carrier gas is at least one of helium (He), hydrogen ($H_2$), argon (Ar) gas and the flow rate thereof is in the range of 10–700 sccm.

21. The method of forming a copper wiring in a semiconductor device according to claim 15, wherein the temperature of gas lines and source lines extending from a vaporizer in said direct liquid injection system to said reactive chamber are kept the same as that of the temperature of said vaporizer.

22. The method of forming a copper wiring in a semiconductor device according to claim 15, wherein the internal temperature of said reactive chamber and the temperature of a showering head in said reactive chamber are kept the same as that of a vaporizer in said direct liquid injection system.

23. The method of forming a copper wiring in a semiconductor device according to claim 15, wherein the temperature of a susceptor plate in said reactive chamber is in the range of 150–180° C.

24. The method of forming a copper wiring in a semiconductor device according to claim 15, wherein the internal pressure of said reactive chamber is kept in the range of 0.1–5 torr.

25. The method of forming a copper wiring in a semiconductor device according to claim 15, wherein the distance between a showering head and a susceptor plate in said reactive chamber is in the range of 1–50 mm.

26. The method of forming a copper wiring in a semiconductor device according to claim 15, wherein the flow rate of said (hfac)Cu(DMB) precursor is in the range of 0.1–1.0 sccm.

27. A method of forming a copper wiring in a semiconductor device, comprising the steps of:

forming an interlayer insulating film on a semiconductor substrate in which various components for forming a semiconductor device are formed;

forming a contact hole and a trench on said interlayer insulating film;

forming a diffusion barrier layer on the surface of said interlayer insulating film including said contact hole and said trench;

depositing Cu so that said contact hole and said trench are filled, using a (hfac)Cu(DMB) precursor by metal organic chemical vapor deposition (MOCVD) method in a direct liquid injection system provided with a reactive chamber; and forming a copper wiring by performing a chemical mechanical polishing process, wherein DMB of 0.1–30% is added or Hhfac of 0.1–20% is added or a combination of DMB and Hhfac is added to the (hfac)Cu(DMB) precursor, as an additive.

28. A method of forming a copper wiring in a semiconductor device, comprising the steps of:

forming an interlayer insulating film on a semiconductor substrate in which various components for forming a semiconductor device are formed;

forming a contact hole and a trench on said interlayer insulating film;

forming a diffusion barrier layer on the surface of said interlayer insulating film including said contact hole and said trench;

depositing Cu so that said contact hole and said trench are filled, using a (hfac)Cu(DMB) precursor by metal organic chemical vapor deposition (MOCVD) method in a direct liquid injection system provided with a reactive chamber; and forming a copper wiring by performing a chemical mechanical polishing process, wherein after said Cu deposition process, a hydrogen reduction thermal process is performed in situ with no time delay, wherein the hydrogen reduction thermal process is performed in a temperature range of room temperature –350° C., for a time frame of 30 minutes –3 hours, under a hydrogen reduction atmosphere.

29. The method of forming a copper wiring in a semiconductor device according to claim 28, wherein said hydrogen reduction atmosphere uses any one of $H_2$, $H_2$+Ar (1–95%) and $H_2$+$N_2$ (1–95%).

30. A method of forming a copper wiring in a semiconductor device, comprising the steps of:

forming an interlayer insulating film on a semiconductor substrate in which various components for forming a semiconductor device are formed;

forming a contact hole and a trench on said interlayer insulating film;

forming a diffusion barrier layer on the surface of said interlayer insulating film including said contact hole and said trench;

depositing Cu so that said contact hole and said trench are filled, using a (hfac)Cu(DMB) precursor by metal organic chemical vapor deposition (MOCVD) method in a direct liquid injection system provided with a reactive chamber; and forming a copper wiring by performing a chemical mechanical polishing process, wherein after the process of forming said diffusion barrier, a cleaning process is performed, and wherein said cleaning process and said diffusion barrier forming process are performed in-situ with no time delay.

31. A method of forming a copper wiring in a semiconductor device, comprising the steps of:
    forming an interlayer insulating film on a semiconductor substrate in which various components for forming a semiconductor device are formed;
    forming a contact hole and a trench on said interlayer insulating film;
    forming a diffusion barrier layer on the surface of said interlayer insulating film including said contact hole and said trench;
    forming a copper layer so that said contact hole and said trench are filled using a (hfac)Cu(DMB) precursor by metal organic chemical vapor deposition (MOCVD) method in a control evaporation mixer provided with a reactive chamber; and
    forming a copper wiring by performing a chemical mechanical polishing process.

32. The method of forming a copper wiring in a semiconductor device according to claim 31, wherein said contact hole and said trench are formed in a dual damascene method.

33. The method of forming a copper wiring in a semiconductor device according to claim 31, wherein said diffusion barrier layer is formed of at least one of ionized PVD TiN, CVD TiN, MOCVD TiN, ionized PVD Ta, ionized PVD TaN, CVD Ta, CVD TaN and CVD WN.

34. The method of forming a copper wiring in a semiconductor device according to claim 31, wherein the temperature of a control valve in a vaporizer of said control evaporation mixer is kept at room temperature and the temperature of a heat exchanger in said vaporizer is in the range of 40–120° C.

35. The method of forming a copper wiring in a semiconductor device according to claim 31, wherein the temperature of a carrier gas induced into a control valve in a vaporizer of the control evaporation mixer is controlled to be in the range of 20° C.–140° C., wherein the temperature of the carrier gas is lower or higher than that of the temperature of a heat exchanger in said vaporizer.

36. The method of forming a copper wiring in a semiconductor device according to claim 35, wherein said carrier gas is at least one of helium (He), hydrogen ($H_2$), argon (Ar) gas and the flow rate thereof is in the range of 10–700 sccm.

37. The method of forming a copper wiring in a semiconductor device according to claim 31, wherein the temperature of gas lines and source lines extending from a vaporizer of the control evaporation mixer to said reactive chamber are kept the same as or 5–20° C. higher than that of a heat exchanger in said vaporizer.

38. The method of forming a copper wiring in a semiconductor device according to claim 31, wherein the internal temperature of said reactive chamber and the temperature of a showering head in said reactive chamber are kept the same as that of a heat exchanger in a vaporizer of the control evaporation mixer.

39. The method of forming a copper wiring in a semiconductor device according to claim 31, wherein the temperature of a susceptor plate in said reactive chamber is in the range of 120–280° C.

40. The method of forming a copper wiring in a semiconductor device according to claim 31, wherein the internal pressure of said reactive chamber is kept in the range of 0.1–5 torr.

41. The method of forming a copper wiring in a semiconductor device according to claim 31, wherein the distance between a showering head and a susceptor plate in said reactive chamber is in the range of 1–50 mm.

42. A method of forming a copper wiring in a semiconductor device, comprising the steps of:
    forming an interlayer insulating film on a semiconductor substrate in which various components for forming a semiconductor device are formed;
    forming a contact hole and a trench on said interlayer insulating film;
    forming a diffusion barrier layer on the surface of said interlayer insulating film including said contact hole and said trench;
    forming a copper layer so that said contact hole and said trench are filled using a (hfac)Cu(DMB) precursor by metal organic chemical vapor deposition (MOCVD) method in a control evaporation mixer provided with a reactive chamber; and
    forming a copper wiring by performing a chemical mechanical polishing process, wherein DMB of 0.1–30% is added or Hhfac of 0.1–20% is added or a combination of DMB and Hhfac is added to the (hfac)Cu(DMB) precursor, as an additive.

43. A method of forming a copper wiring in a semiconductor device, comprising the steps of:
    forming an interlayer insulating film on a semiconductor substrate in which various components for forming a semiconductor device are formed;
    forming a contact hole and a trench on said interlayer insulating film;
    forming a diffusion barrier layer on the surface of said interlayer insulating film including said contact hole and said trench;
    forming a copper layer so that said contact hole and said trench are filled using a (hfac)Cu(DMB) precursor by metal organic chemical vapor deposition (MOCVD) method in a control evaporation mixer provided with a reactive chamber; and
    forming a copper wiring by performing a chemical mechanical polishing process, wherein after said Cu deposition process, a hydrogen reduction thermal process is performed in situ with no time delay, wherein the hydrogen reduction thermal process is performed in a temperature range of room temperature –350° C., for a time frame of 30 minutes –3 hours, under a hydrogen reduction atmosphere.

44. The method of forming a copper wiring in a semiconductor device according to claim 43, wherein said hydrogen reduction atmosphere uses any one of $H_2$, $H_2$+Ar91–95%) and $H_2$+$N_2$ (1–95%).

45. A method of forming a copper wiring in a semiconductor device, comprising the steps of:
    forming an interlayer insulating film on a semiconductor substrate in which various components for forming a semiconductor device are formed;
    forming a contact hole and a trench on said interlayer insulating film;
    forming a diffusion barrier layer on the surface of said interlayer insulating film including said contact hole and said trench;
    forming a copper layer so that said contact hole and said trench are filled using a (hfac)Cu(DMB) precursor by metal organic chemical vapor deposition (MOCVD) method in a control evaporation mixer provided with a reactive chamber; and forming a copper wiring by performing a chemical mechanical polishing process, wherein after the process of forming said diffusion barrier, a cleaning process is performed, and wherein said cleaning process and said diffusion barrier forming process are performed in-situ with no time delay.

46. A method of forming a copper wiring in a semiconductor device, comprising the steps of:

forming an interlayer insulating film on a semiconductor substrate in which various components for forming a semiconductor device are formed;

forming a contact hole and a trench on said interlayer insulating film;

forming a diffusion barrier layer on the surface of said interlayer insulating film including said contact hole and said trench;

forming a copper layer so that said contact hole and said trench can be sufficiently filled using a (hfac)Cu(VTMOS) precursor by metal organic chemical vapor deposition (MOCVD) method in a liquid delivery system provided with a reactive chamber and having a vaporizer of an orifice type or a spray type; and forming a copper wiring by performing a chemical mechanical polishing process.

47. The method of forming a copper wiring in a semiconductor device according to claim 46, wherein said contact hole and said trench are formed in a dual damascene method.

48. The method of forming a copper wiring in a semiconductor device according to claim 46, wherein said diffusion barrier layer is formed of at least one of ionized PVD TiN, CVD TiN, MOCVD TiN, ionized PVD Ta, ionized PVD TaN, CVD Ta, CVD TaN and CVD WN.

49. The method of forming a copper wiring in a semiconductor device according to claim 46, wherein the temperature of the vaporizer is in the range of 20–120° C.

50. The method of forming a copper wiring in a semiconductor device according to claim 46, wherein the temperature of a carrier gas induced into the vaporizer is controlled to be in the range of 40–140° C. which is 20° C. higher than that of the vaporizer.

51. The method of forming a copper wiring in a semiconductor device according to claim 50, wherein said carrier gas is at least one of helium (He), hydrogen ($H_2$), argon (Ar) gas and the flow rate thereof is in the range of 10–700 sccm.

52. The method of forming a copper wiring in a semiconductor device claim 46, wherein the temperature of gas lines and source lines that extend from said vaporizer to said reactive chamber are kept the same as that of the temperature of said vaporizer.

53. The method of forming a copper wiring in a semiconductor device according to claim 46, wherein the internal temperature of said reactive chamber and the temperature of showering head are kept the same as that of said vaporizer.

54. The method of forming a copper wiring in a semiconductor device according to claim 46, wherein the temperature of a susceptor plate in said reactive chamber is in the range of 120–280° C.

55. The method of forming a copper wiring in a semiconductor device according to claim 46, wherein the internal pressure of said reactive chamber is kept in the range of 0.1–5 torr.

56. The method of forming a copper wiring in a semiconductor device according to claim 46, wherein the distance between a showering head and a susceptor plate in said reactive chamber is in the range of 1–50 mm.

57. The method of forming a copper wiring in a semiconductor device according to claim 46, wherein the flow rate of said (hfac)Cu(VTMOS) precursor is in the range of 0.1–1.0 sccm.

58. A method of forming a copper wiring in a semiconductor device, comprising the steps of:

forming an interlayer insulating film on a semiconductor substrate in which various components for forming a semiconductor device are formed;

forming a contact hole and a trench on said interlayer insulating film;

forming a diffusion barrier layer on the surface of said interlayer insulating film including said contact hole and said trench;

forming a copper layer so that said contact hole and said trench can be sufficiently filled using a (hfac)Cu(VTMOS) precursor by metal organic chemical vapor deposition (MOCVD) method in a liquid delivery system provided with a reactive chamber and having a vaporizer of an orifice type or a spray type; and forming a copper wiring by performing a chemical mechanical polishing process, wherein DMB of 0.1–30% is added or Hhfac of 0.1–20% is added or a combination of DMB and Hfac is added to the (hfac)Cu(VTMOS) precursor, as an additive.

59. A method of forming a copper wiring in a semiconductor device, comprising the steps of:

forming an interlayer insulating film on a semiconductor substrate in which various components for forming a semiconductor device are formed;

forming a contact hole and a trench on said interlayer insulating film;

forming a diffusion barrier layer on the surface of said interlayer insulating film including said contact hole and said trench;

forming a copper layer so that said contact hole and said trench can be sufficiently filled using a (hfac)Cu(VTMOS) precursor by metal organic chemical vapor deposition (NOCVD) method in a liquid delivery system provided with a reactive chamber and having a vaporizer of an orifice type or a spray type; and forming a copper wiring by performing a chemical mechanical polishing process, wherein after said Cu deposition process, a hydrogen reduction thermal process is performed in situ with no time delay, wherein the hydrogen reduction thermal process is performed in a temperature range of room temperature –350° C., for a time frame of 30 minutes –3 hours, under a hydrogen reduction atmosphere.

60. The method of forming a copper wiring in a semiconductor device according to claim 59, wherein said hydrogen reduction atmosphere uses any one of $H_2$, $H_2$+Ar (1–95%) and $H_2$+$N_2$ (1–95%).

61. A method of forming a copper wiring in a semiconductor device, comprising the steps of:

forming an interlayer insulating film on a semiconductor substrate in which various components for forming a semiconductor device are formed;

forming a contact hole and a trench on said interlayer insulating film;

forming a diffusion barrier layer on the surface of said interlayer insulating film including said contact hole and said trench;

forming a copper layer so that said contact hole and said trench can be sufficiently filled using a (hfac)Cu (VTMOS) precursor by metal organic chemical vapor deposition (MOCVD) method in a liquid delivery system provided with a reactive chamber and having a vaporizer of an orifice type or a spray type; and forming a copper wiring by performing a chemical mechanical polishing process, wherein after the process of forming said diffusion barrier, a cleaning process is performed, and wherein said cleaning process and said diffusion barrier forming process are performed in-situ with no time delay.

62. A method of forming a copper wiring in a semiconductor device, comprising the steps of:

forming an interlayer insulating film on a semiconductor substrate;

forming a diffusion barrier layer on the surface of said interlayer insulating film;

depositing Cu on the interlayer insulating film using a (hfac)Cu(DMB) precursor by metal organic chemical vapor deposition (MOCVD) method in a liquid delivery system provided with a reactive chamber; and forming a copper wiring.

63. The method of forming a copper wiring in a semiconductor device according to claim 62, wherein said liquid delivery system employs one of a bubbler, a direct liquid injection system, control evaporation mixer and a vaporizer of an orifice or spray type.

64. The method of forming a copper wiring in a semiconductor device according to claim 62, wherein said diffusion barrier layer is formed of at least one of ionized PVD TiN, CVD TiN, MOCVD TiN, ionized PVD Ta, ionized PVD TaN, CVD Ta, CVD TaN and CVD WN.

65. The method of forming a copper wiring in a semiconductor device according to claim 62, wherein the step of forming an interlayer insulating film includes forming a contact hole and trench on said interlayer insulating film, and the step of depositing Cu includes depositing the Cu such that the contact hole and trench are filled.

66. A method of forming a copper wiring in a semiconductor device, comprising the steps of:

forming an interlayer insulating film on a semiconductor substrate;

forming a diffusion barrier layer on the surface of said interlayer insulating film;

depositing Cu on the interlayer insulating film using a (hfac)Cu(DMB) precursor by metal organic chemical vapor deposition (MOCVD) method in a liquid delivery system provided with a reactive chamber; and forming a copper wiring,
wherein the step of forming the copper wiring includes performing a hydrogen reduction thermal process on the Cu deposited on the interlayer insulating film.

67. The method of forming a copper wiring in a semiconductor device according to claim 65, wherein the step of forming the copper wiring further includes performing a chemical mechanical polishing process.

68. A method of forming a copper wiring in a semiconductor device, comprising the steps of:

forming an interlayer insulating film on a semiconductor substrate;

depositing Cu on the interlayer insulating film using a (hfac)Cu(DMB) precursor by metal organic chemical vapor deposition (MOCVD) method in a liquid delivery system provided with a reactive chamber; and forming a copper wiring.

69. The method of forming a copper wiring in a semiconductor device, according to claim 67, wherein the liquid delivery system includes one a bubbler, a direct liquid injection system, a control evaporation mixer and a vaporizer of an orifice or spray type.

70. The method of forming a copper wiring in a semiconductor device, according to claim 68, wherein the liquid delivery system includes one a bubbler, a direct liquid injection system, a control evaporation mixer and a vaporizer of an orifice or spray type.

71. The method of forming a copper wiring in a semiconductor device according to claim 46, wherein the temperature of the vaporizer is one of below 50° C. and above 70° C.

72. The method of forming a copper wiring in a semiconductor device according to claim 50, wherein said carrier gas is at least one of helium (He), hydrogen ($H_2$), argon (Ar) gas and the flow rate thereof is one of below 50 sccm and above 500 sccm.

73. The method of forming a copper wiring in a semiconductor device according to claim 15, wherein the temperature of a vaporizer is one of below 50° C. and above 70° C.

74. The method of forming a copper wiring in a semiconductor device according to claim 15, wherein a carrier gas induced into a vaporizer in said direct liquid injection system is at least one of helium (He), hydrogen ($H_2$), argon (Ar) gas and the flow rate thereof is one of below 50 scam and above 500 sccm.

75. The method of forming a copper wiring in a semiconductor device according to claim 31, wherein a carrier gas induced into a control valve in a vaporizer of said control evaporation mixer at least one of helium (He), hydrogen ($H_2$), argon (Ar) gas and the flow rate thereof is one of below 50 sccm and above 500 sccm.

* * * * *

UNITED STATES PATENT AND TRADEMARK OFFICE
CERTIFICATE OF CORRECTION

PATENT NO. : 6,337,276 B1
DATED : January 8, 2002
INVENTOR(S) : Sung Gyu Pyo

It is certified that error appears in the above-identified patent and that said Letters Patent is hereby corrected as shown below:

Column 18,
Line 52, "$H_2$+Ar91-95%)" should read -- $H_2$+Ar (91-95%) --.

Column 19,
Line 48, "device claim" should read -- device according to claim --.

Column 20,
Line 40, "(NOCVD)" should read -- (MOCVD) --.

Column 22,
Lines 17 and 22, "one a" should read -- one of a --.
Line 44, "scam" should read -- sccm --.

Signed and Sealed this

Thirtieth Day of March, 2004

JON W. DUDAS
*Acting Director of the United States Patent and Trademark Office*